(12) United States Patent
Dupree et al.

(10) Patent No.: US 7,692,882 B2
(45) Date of Patent: Apr. 6, 2010

(54) LASER DIODE AND LENS ASSEMBLIES

(75) Inventors: Brent Steven Dupree, Lexington, KY (US); Danny Wayne Peters, Lexington, KY (US); Louis Anthony Wantland, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 11/776,569

(22) Filed: Jul. 12, 2007

(65) Prior Publication Data

US 2009/0015931 A1   Jan. 15, 2009

(51) Int. Cl.
  *G02B 7/02* (2006.01)
(52) U.S. Cl. ...................... 359/811; 359/819
(58) Field of Classification Search ................. 359/811, 359/819
See application file for complete search history.

(56) References Cited

U.S. PATENT DOCUMENTS

| 5,689,378 | A  | * | 11/1997 | Takashima et al. .......... 359/813 |
| 7,136,088 | B2 |   | 11/2006 | Yoshida et al. |
| 7,151,557 | B2 |   | 12/2006 | Boyatt, III et al. |
| 7,152,798 | B2 |   | 12/2006 | Cannon et al. |
| 7,158,321 | B2 |   | 1/2007  | Peters |
| 2006/0238605 | A1 | | 10/2006 | Dodds |

* cited by examiner

*Primary Examiner*—Jordan M. Schwartz
*Assistant Examiner*—James C Jones

(57) ABSTRACT

A laser diode assembly and a tens assembly associated with a pre-scan unit for use in a laser printer are presented. Further presented is a laser diode/collimation lens apparatus. Each of the laser diode assembly, the lens assembly and the laser diode/collimation lens apparatus includes a mounting bracket comprising a compressible section.

12 Claims, 10 Drawing Sheets

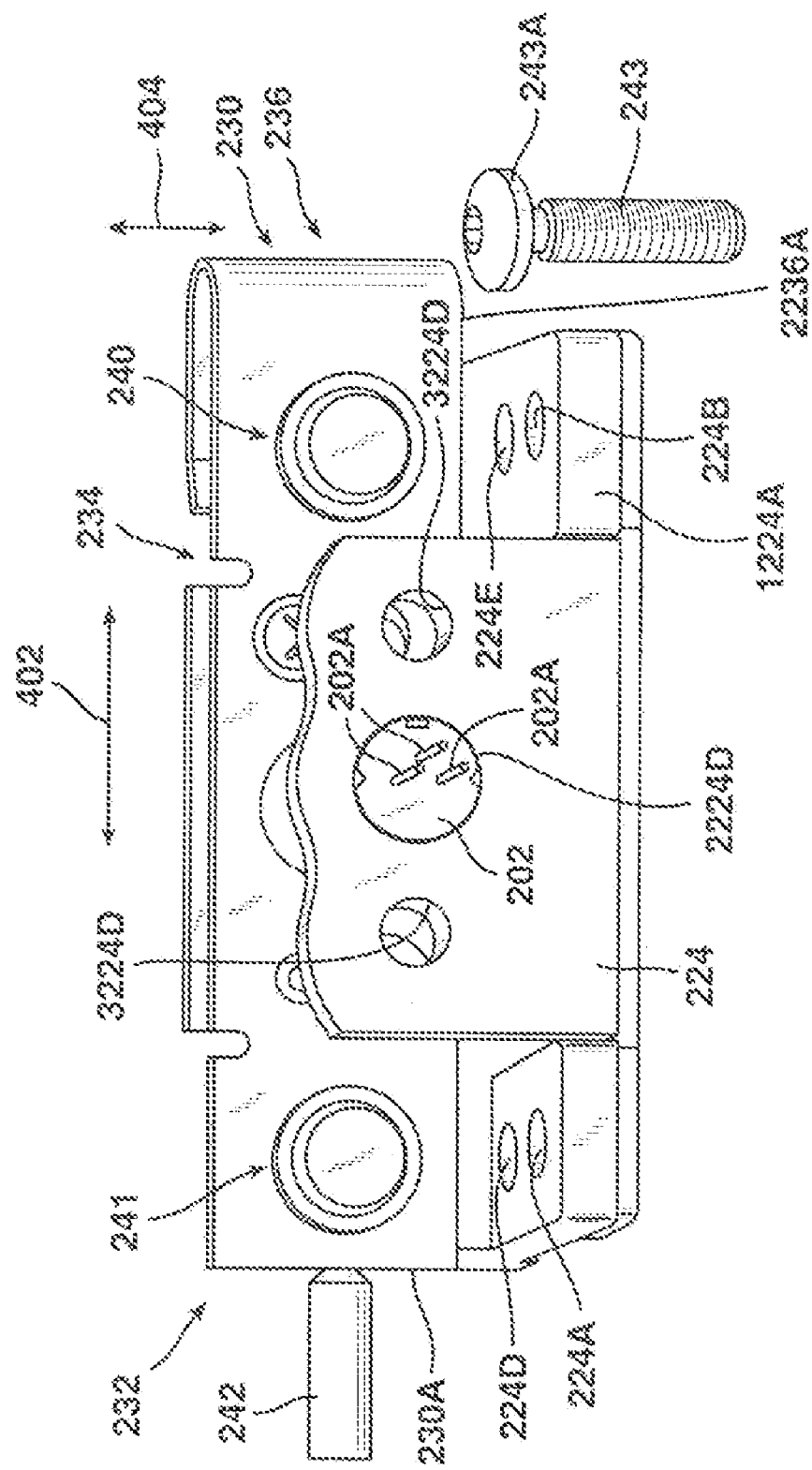

LASER DIODE AND LENS ASSEMBLIES

FIELD OF THE INVENTION

The present invention relates generally to a pre-scan unit for use in a laser printer and more particularly to an apparatus for adjusting laser pointing and focus in a laser printer pre-scan unit.

BACKGROUND OF THE INVENTION

Optical systems used in laser printers may be characterized as having three sub-systems or assemblies, namely, a laser diode/pre-scan optical assembly, a scanning assembly, and a post scan assembly. Typically, the laser diode/pre-scan optical assembly includes a laser diode emitting a diverging laser beam, a collimation lens for collimating the beam emitted by the laser diode, and a pre-scan lens to focus the beam in a process direction prior to it striking the scanning device. During manufacturing, the distance between the laser diode and the collimation lens may be varied so as to focus the beam emitted by the laser diode relative to the collimation lens. Also during manufacturing, the position of the collimation lens assembly may be adjusted relative to the pre-scan lens. It would be desirable to have an improved apparatus for adjusting the distance between the laser diode and the collimation lens in a focus direction during manufacture. If would further be desirable to have an improved apparatus for adjusting the position of the collimation lens assembly relative to the pre-scan lens in a process direction during manufacture.

SUMMARY OF THE INVENTION

In accordance with a first aspect of the present invention, a laser diode assembly is provided for use in a laser scanner. The laser diode assembly may comprise: a mounting structure; a laser diode; a mounting bracket comprising a first section capable of being coupled to the mounting structure, a second section coupled to the first section and having an aperture for receiving the laser diode, and a compressible third section coupled to the second section; and a first fastener coupled to the laser mounting structure and in engagement with the mounting bracket third section. The first fastener is adjustable so as to cause the mounting bracket second section to move relative to the mounting structure and to change the distance between the laser diode and the mounting structure.

The mounting bracket third section may comprise first and second spaced apart parts and a third part joining the first and second parts together.

The mounting bracket first, second and third parts may define a generally U-shaped third section.

The mounting bracket first and second parts may comprise apertures for receiving the first fastener.

Adjustment of the first fastener may cause the first and second parts to move relative to one another.

The laser diode assembly may further comprise a second fastener for coupling the mounting bracket first section to the mounting structure.

In accordance with a second aspect of the present invention, a lens assembly is provided for use in a laser scanner. The lens assembly may comprise: a mounting structure; a lens; a barrel for receiving the lens; and a mounting bracket comprising a first section capable of being coupled to the mounting structure, a second section coupled to the first section and shaped to engage the barrel, and a compressible third section coupled to the second section; and a first fastener coupled to the mounting structure and in engagement with the mounting bracket third section. The first fastener is adjustable so as to cause the mounting bracket second section to move relative to the mounting structure and to change the position of the lens relative to the mounting structure.

The mounting bracket third section may comprise first and second spaced apart parts and a third part joining the first and second parts together.

The mounting bracket first, second and third parts may define a generally U-shaped third section.

The mounting bracket first, second and third parts may comprise apertures for receiving the first fastener.

Adjustment of the first fastener may cause the first and second parts to move relative to one another.

The mounting bracket third section may be coupled to the barrel.

The barrel may have a generally cylindrical shape and may define an aperture for a laser beam directed toward the lens.

The mounting bracket second section may have a curved shape to receive the generally cylindrically shaped barrel.

The lens may be mounted within the barrel.

The lens assembly may further comprise a second fastener for coupling the mounting bracket first section to the mounting structure.

In accordance with a third aspect of the present invention, a laser diode/collimation lens apparatus is provided comprising: a laser diode for generating a laser beam; a collimation lens structure; a mounting structure; a lens structure bracket and a first fastener. The lens structure bracket is capable of being coupled to the mounting structure and may comprise a first section, a second section coupled to the first section, and a compressible third section coupled to the second section. The second section may be configured to engage the collimation lens structure. The first fastener may be coupled to the mounting structure and in engagement with the lens structure bracket third section. The fastener is adjustable so as to cause the lens structure bracket second section and the collimation lens structure to move relative to the mounting structure to change a distance between the laser diode and the lens structure in a first direction.

The collimation lens structure may comprise a collimation lens and a lens keeper for receiving the collimation lens. The lens keeper may be coupled to the lens structure bracket second section.

The mounting structure may comprise a housing and a mounting bracket coupled to the housing.

The mounting bracket may comprise first, second and third mount members. The first fastener may be coupled to the first mount member and the third mount member may have an aperture for receiving the laser diode.

The laser diode/collimation tens apparatus may further comprise second, third and fourth fasteners. The second fastener may be coupled to the second mount member and in engagement with the lens structure bracket first section. The third fastener may be coupled to the housing and in engagement with the lens structure bracket. The third fastener may be adjustable so as to cause the lens structure bracket, the lens keeper and the collimation lens to move relative to the mounting bracket to change a position of the collimation lens relative to the laser diode in a second direction. The fourth fastener may be coupled to the housing and in engagement with the lens structure bracket. The fourth fastener may be adjustable so as to cause the lens structure bracket, the lens keeper and the collimation lens to move relative to the mounting bracket to change a position of the collimation lens relative to the laser diode in a third direction.

The lens structure bracket third section may comprise first and second spaced apart parts having oversized apertures for receiving the first fastener and a third part joining the first and second parts together defining a generally U-shaped third section.

BRIEF DESCRIPTION OF THE DRAWINGS

The following detailed description of the preferred embodiments of the present invention can best be understood when read in conjunction with the following drawings, where like structure is indicated with like reference numerals, and in which:

FIG. 10 is a perspective view of the laser diode/collimation lens apparatus of FIG. 8 taken from the laser diode side and with the housing removed.

DETAILED DESCRIPTION OF THE INVENTION

In the following detailed description of the preferred embodiments, reference is made to the accompanying drawings that form a part hereof, and in which is shown by way of illustration, and not by way of limitation, a specific preferred embodiments in which the invention may be practiced. It is to be understood that other embodiments may be utilized and that changes may be made without departing from the spirit and scope of the present invention.

Figure 1:
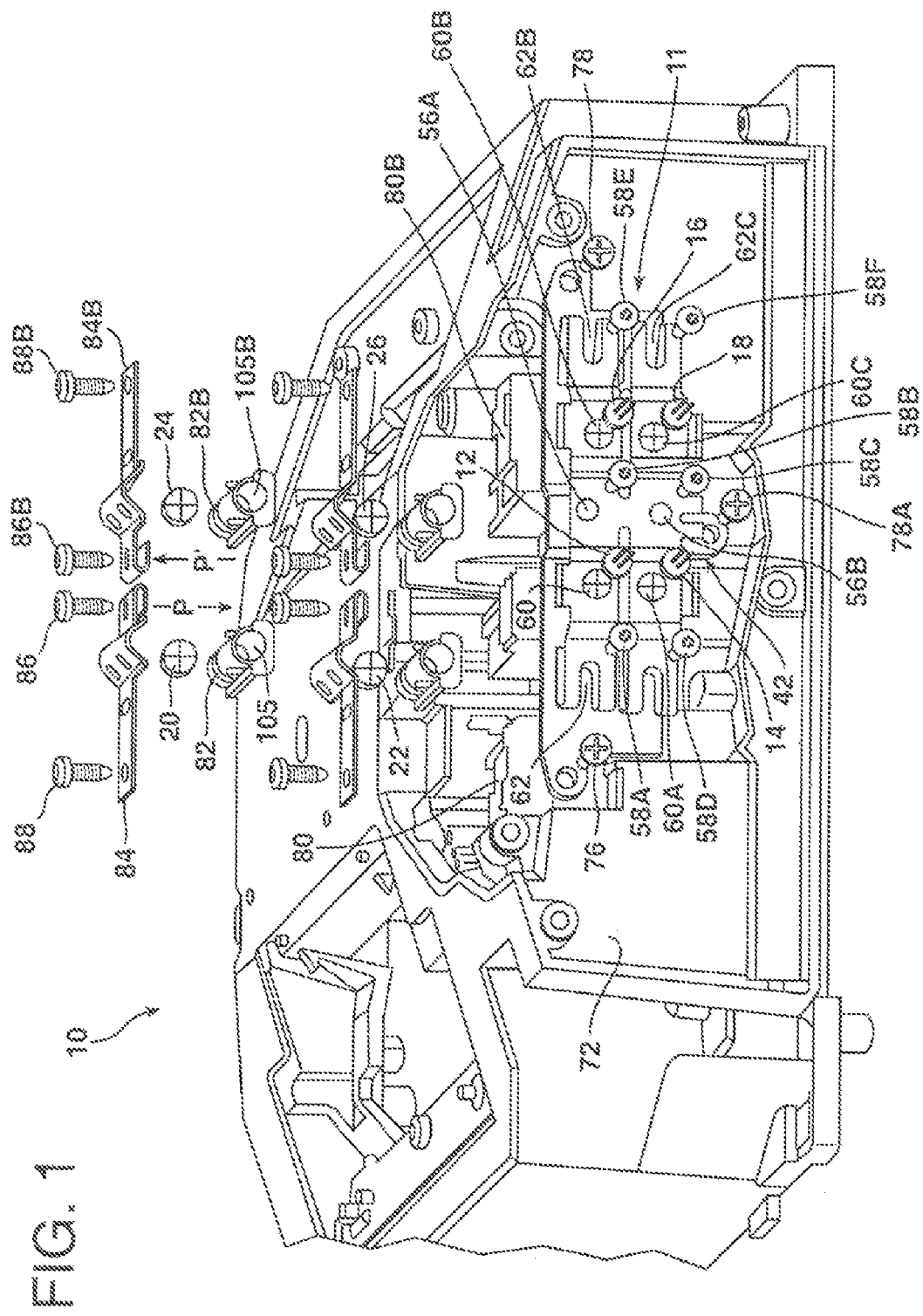
FIG. 1 is a diagrammatic perspective view of a printhead as used in a color laser printer showing preferred embodiments of a laser diode assembly and a collimation lens assembly of the present invention in exploded view.

FIG. 1 depicts a printhead, indicated generally by reference numeral 10, for use in a color laser printer (not shown), comprising a laser diode/pre-scan assembly 11 constructed in accordance with the present invention. The printhead 10 further comprises a scanning assembly (not shown) and a post scan assembly (not shown).

Figure 2:
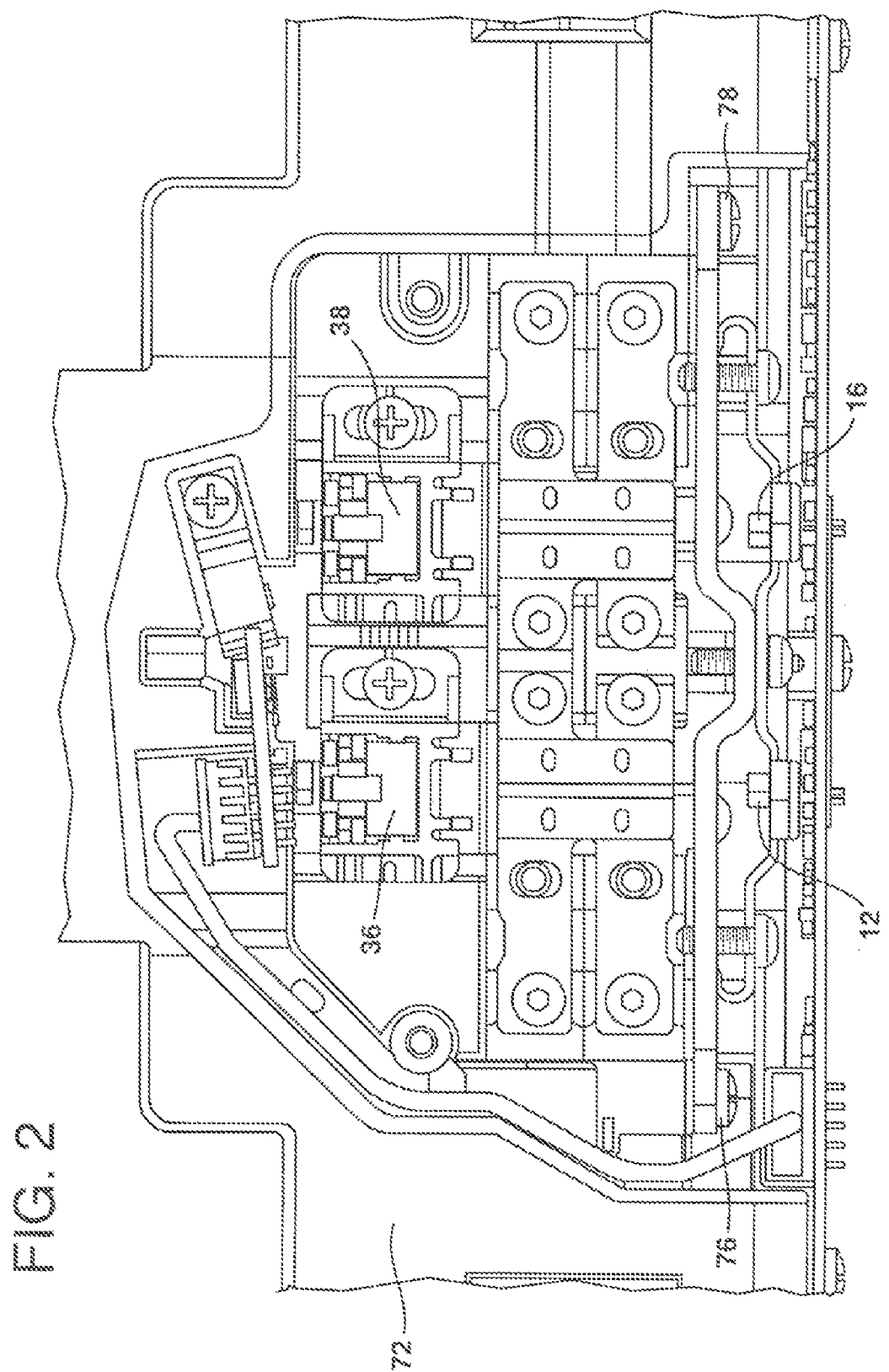
FIG. 2 is a top plan view of a pre-scan assembly as used in the printhead of FIG. 1 showing a laser diode assembly and a collimation lens assembly mounted in a printhead housing.
Figure 3:
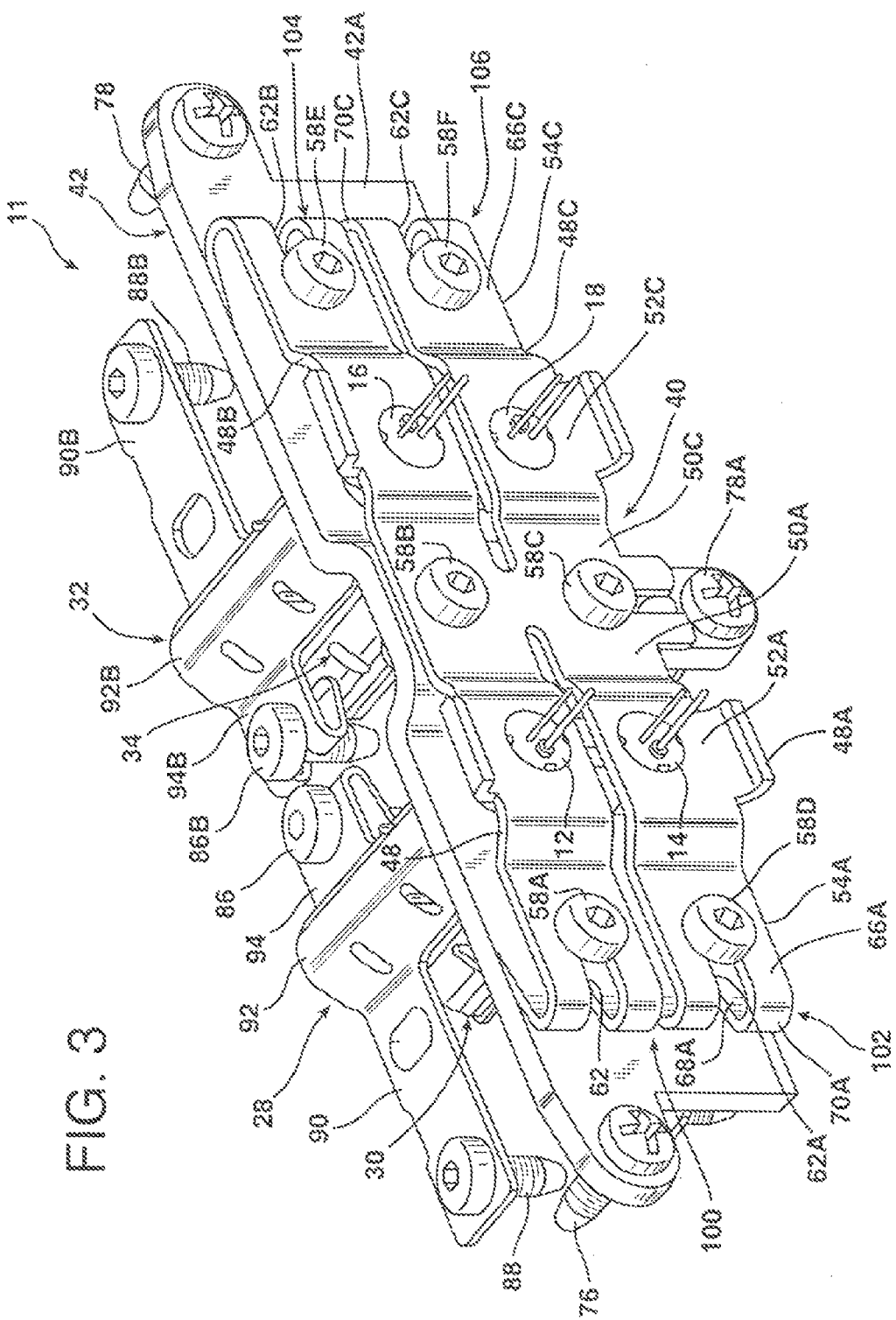
FIG. 3 is a diagrammatic perspective view of a four unit laser diode assembly and partial views of four collimation lens assemblies taken from the laser diode side of the assembly.

First, second, third and fourth laser diodes 12, 14, 16 and 18 generate separate laser beams (not shown) corresponding, for example, to the colors yellow, cyan, magenta and black, see FIGS. 1 and 3. The individual beams (not shown) are directed through corresponding first, second, third and fourth collimation lenses 20, 22, 24 and 26, where the beams are collimated or nearly collimated, see FIGS. 4-5. For example, a beam may be considered "nearly collimated" when the beam converges between about 300 mm to about 400 mm downstream from its corresponding collimation lens 20, 22, 24 and 26 in the scan direction. Once collimated, two pairs of substantially parallel beams pass through first and second pre-scan lenses 36 and 38, one pair of beams passing through each pre-scan lens, see FIG. 2, where they are focused in a process direction prior to striking a rotating polygonal mirror (not shown) from which they are reflected into the post scan assembly (not shown).

Proper operation of the printhead 10 requires that the pairs of individual laser beams emitted from laser diode pairs 12 and 14 and 16 and 18 passing through respective pre-scan lenses 36 and 38 nearly converge to points on the rotating mirror (not shown). For example, the laser beams emitted from the laser diodes 12 and 14 may strike a common first facet on the rotating mirror (not shown) such that they are slightly spaced apart from one another, e.g., 100 microns, in the process direction, while the laser beams emitted from the laser diodes 16 and 18 may strike a common second facet on the rotating mirror (not shown) so as to be slightly spaced apart from one another, e.g., 100 microns, in the process direction.

In the illustrated embodiment, the laser diode/pre-scan assembly 11 comprises first, second, third and fourth laser diode assemblies 100, 102, 104 and 106, which, in the illustrated embodiment, define a single laser diode assembly structure 40, see FIG. 3. The laser diode/pre-scan assembly 11 further comprises first, second, third and fourth lens assemblies 28, 30, 32 and 34, see FIG. 4.

Figure 6:
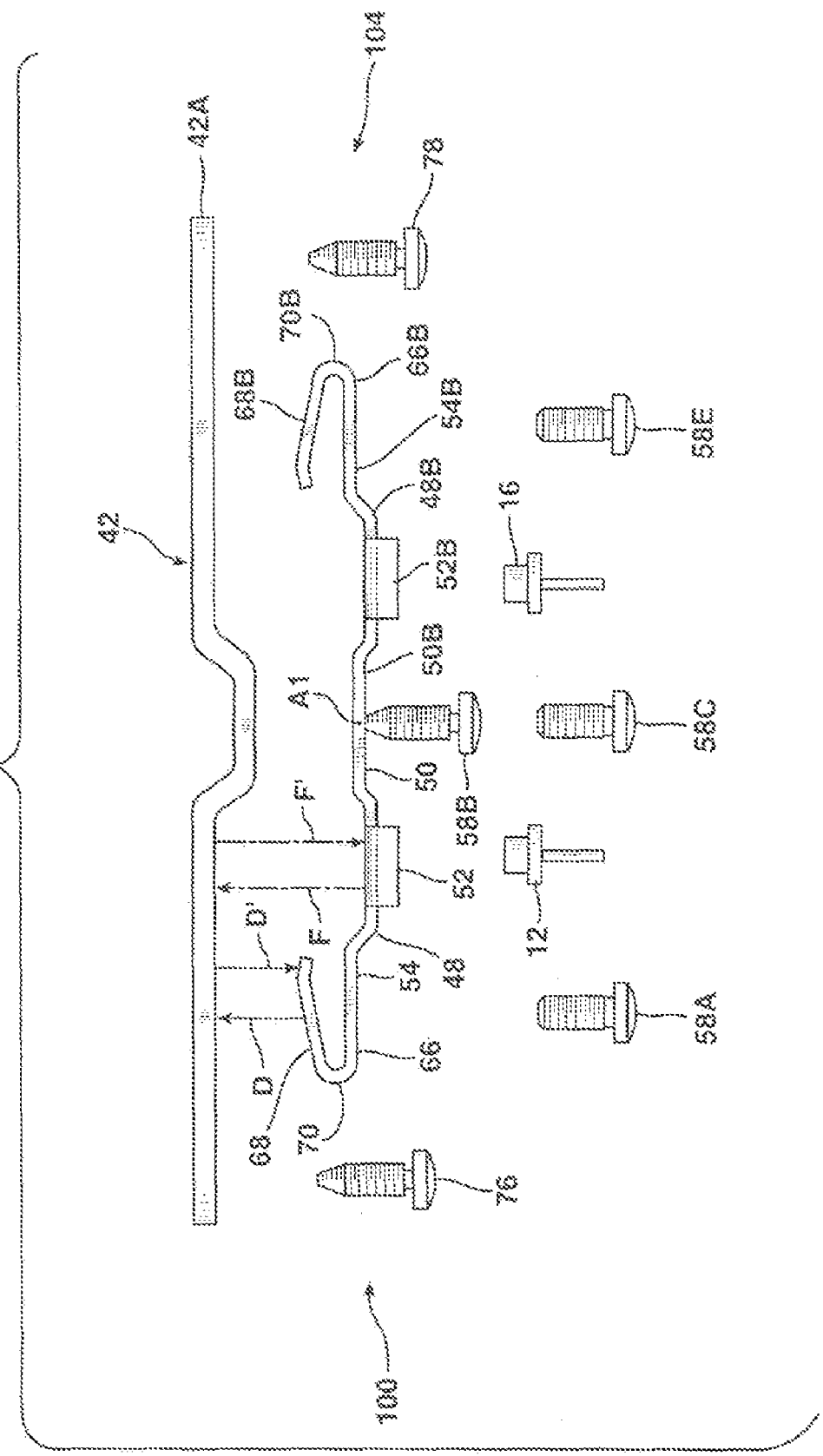
FIG. 6 is an exploded view of two of the laser diode assemblies of FIG. 3 taken from the top.

Referring now to FIGS. 3 and 6, the first laser diode assembly 100 comprises the first laser diode 12, a first mounting bracket 48, first, second and third fasteners 58A-58C and a mounting structure 42. In the illustrated embodiment, the mounting structure 42 comprises a plate 42A. The plate 42A is coupled to a printhead housing 72 by fasteners 76, 78 and 78A, see FIGS. 1 and 3.

The first mounting bracket 48 comprises a first section 50, a second section 52 and a third section 54, see FIG. 6. The first section 50 includes apertures 56A and 56B for receiving the second and third fasteners 58B and 58C to fixedly couple the first mounting bracket first section 50 to the plate 42A, see FIGS. 1 and 3. The second section 52 includes an aperture 60 for receiving the first laser diode 12, which, in the illustrated embodiment, is substantially cylindrical in shape, see FIG. 1. The third section 54 comprises, in the illustrated embodiment, a substantially planar first part 66 spaced apart from and positioned substantially parallel with a substantially planar second part 68, and an arcuate-shaped third pad 70 joining the first part 66 together with second part 68 into a generally U-shaped compressible third section, see FIG. 6. First fastener 58A passes through apertures in the first and second parts 66, 68 defined, in the illustrated embodiment, by a single elongated slot 62, see FIGS. 1 and 3, and further into a threaded bore (not shown) in the plate 42A, see FIGS. 1, 3 and 6. In this fashion, an adjustable compressive force may be applied to the compressible third section 54 in a direction parallel to the axis of the first fastener 58A by increasing or decreasing a tightening torque applied to the first fastener 58A.

U-shaped compressible third section 54 may be made from a material such as for example, zinc plated cold rolled steel per ASTM A591-98 with steel substrate per ASTM A109-00, that will yield or deflect from a non-deflected state as a compressive force is applied by increasing the tightening torque applied to the first fastener 58A, causing the first part 66 to move toward the mounting structure plate 42A in direction D, see FIG. 6. Conversely, decreasing the tightening torque applied to first fastener 58A decreases the compressive force applied to the third section 54, allowing the first part 66 to return substantially to its non-deflected state and move away from mounting structure plate 42A in direction D', see FIG. 6.

Referring again to FIG. 6, the second section 52 of the mounting bracket 48 is integral with the third section 54. The second section 52 is also integral with the first section 50. As noted above, the first laser diode 12 is mounted in the second section aperture 60. Thus, as third section first part 66 moves toward the mounting structure plate 42A in direction D, the first laser diode 12 moves toward the mounting structure plate 42A about a slight arc defined by a pivoting motion of the first and second sections 50 and 52 about a pivot axis $A_1$, see FIG. 6. Hence, the laser diode 12 moves generally in a first direction F, see FIG. 6, as it moves toward the mounting structure plate 42A. Conversely, as third section first part 66 moves away from the mounting structure plate 42A in direction D', the laser diode 12 moves away from the mounting structure plate 42 about the same arc previously noted, substantially in a second direction F', see FIG. 6.

The U-shaped compressible third section 54 is configured such that a sufficient range of motion is provided in directions D and D' to move the first laser diode 12 in the focus direction F-F' relative to the first collimation lens 20 so that the laser beam emitted from the collimation lens 20 may be properly collimated or nearly collimated.

Once the focus adjustment has been effected, a suitable thread locking compound may be applied to the exposed threads of first fastener 58A to prevent movement of first fastener 58A and corresponding changes in the focus of the diode 12.

Referring now to FIG. 3, the second laser diode assembly 102 comprises the second laser diode 14, a second mounting bracket 48A, the second and third fasteners 58B and 58C, a fourth fastener 58D and a mounting structure defined by the plate 42A. The second mounting bracket 48A comprises a first section 50A, a second section 52A and a third section 54A. In the illustrated embodiment, the second mounting bracket 48A is formed integral with the first mounting bracket 48. Further, the first section 50A of the second mounting bracket 48A is defined by, i.e., is the same structure as, the first section 50 of the first mounting bracket 48, which include apertures 56A and 56B for receiving the second and third fasteners 58B and 58C, see FIG. 1. The second section 52A includes an aperture 60A for receiving the second laser diode 14, which, in the illustrated embodiment, is substantially cylindrical in shape, see FIG. 1. The third section 54A comprises, in the illustrated embodiment, a substantially planar first part 66A spaced apart from and positioned substantially parallel with a substantially planar second part 68A, and an arcuate-shaped third part 70A joining the first part 66A together with second part 68A into a generally U-shaped compressible third section, see FIG. 3. The fourth fastener 58D passes through apertures in the first and second parts, defined in the illustrated embodiment, by a single elongated slot 62A, see FIG. 3, and further into a threaded bore (not shown) in the plate 42A, see FIGS. 1, 3 and 6. In this fashion, an adjustable compressive force may be applied to the compressible third section 54A in a direction parallel to the axis of fourth fastener 58D by increasing or decreasing a tightening torque applied to the fourth fastener 58D so that the laser beam from the second laser diode 14 may be properly focused relative to the second collimation lens 22; hence, the beam emitted from the second collimation lens 22 is properly collimated or nearly collimated.

Referring now to FIGS. 3 and 6, the third laser diode assembly 104 comprises the third laser diode 16, a third mounting bracket 48B, the second and third fasteners 58B and 58C and a fifth fastener 58E and a mounting structure defined by the plate 42A. The third mounting bracket 48B comprises a first section 50B, a second section 52B and a third section 54B. In the illustrated embodiment, the third mounting bracket 48B is formed integral with the first and second mounting brackets 48 and 48A. Further the first section 50B of the third mounting bracket 48B is defined by the first section 50 of the first mounting bracket 48, which include apertures 56A and 56B for receiving the second and third fasteners 58B and 58C, see FIGS. 1 and 3. The second section 52B includes an aperture 60B for receiving the third laser diode 16, which, in the illustrated embodiment, is substantially cylindrical in shape. The third section 54B comprises, in the illustrated embodiment, a substantially planar first part 66B spaced apart from and positioned substantially parallel with a substantially planar second part 68B, and an arcuate-shaped third part 70B joining the first part 66B together with second part 68B into a generally U-shaped compressible third section, see FIG. 6. The fifth fastener 58E passes through apertures in the first and second parts 66B, 68B, defined in the illustrated embodiment, by a single elongated slot 62B, see FIGS. 1 and, 3, and further into a threaded bore (not shown) in the plate 42A, see FIGS. 1, 3 and 6. In this fashion, an adjustable compressive force may be applied to the compressible third section 54B in a direction parallel to the axis of fifth fastener 58E by increasing or decreasing a tightening torque applied to the fifth fastener 54E so that the laser beam from the third laser diode 16 may foe properly focused relative to the third collimation lens 24; hence, the beam emitted from the third collimation lens 24 is properly collimated or nearly collimated.

Referring to FIGS. 1 and 3, the fourth laser diode assembly 106 comprises the fourth laser diode 18, a fourth mounting bracket 48C, the second and third fasteners 58B and 58C and a sixth fastener 58F and a mounting structure defined by the plate 42A. The fourth mounting bracket 48C comprises a first section 50C, a second section 52C and a third section 54C. In the illustrated embodiment, the fourth mounting bracket 48C is formed integral with the first, second and third mounting brackets 48, 48A and 48B. Further the first section 50C of the fourth mounting bracket 48C is defined by the first section 50 of the first mounting bracket 48, which includes apertures 56A and 56B for receiving the second and third fasteners 58B and 58C, see FIGS. 1 and 3. The second section 52C includes an aperture 60C for receiving the fourth laser diode 18, which, in the illustrated embodiment, is substantially cylindrical in shape. The third section 54C comprises, in the illustrated embodiment, a substantially planar first part 66C spaced apart from and positioned substantially parallel with a substantially planar second part, and an arcuate-shaped third part 70C joining the first part 66C together with second part info a generally U-shaped compressible third section, see FIG. 3. The sixth fastener 58F passes through apertures in the first and second parts (only 66C shown in FIG. 3) defined, in the illustrated embodiment, by a single elongated slot 62C, and further into a threaded bore (not shown) in the plate 42A, see FIGS. 1 and 3. In this fashion, an adjustable compressive force may be applied to the compressible third section 54C in a direction parallel to the axis of sixth fastener 58F by increasing or decreasing a tightening torque applied to the sixth fastener 58F so that the laser beam from the fourth laser diode 18 may be properly focused relative to the fourth collimation lens 26; hence, the beam emitted from the fourth collimation lens 26 is properly collimated or nearly collimated.

As noted above, the laser diode/pre-scan assembly 11 further comprises first, second, third and fourth lens assemblies 28, 30, 32 and 34. The first lens assembly 28 comprises a first mounting structure 80, the first collimation lens 20, a first barrel-shaped housing 82 (also referred to herein as a "barrel"), a first mounting bracket 84 and first and second fasteners 86 and 88, see FIG. 5. The first mounting structure 80 comprises mounting features 81 and 83 forming part of the printhead housing 72, see FIG. 7.

Figure 5:
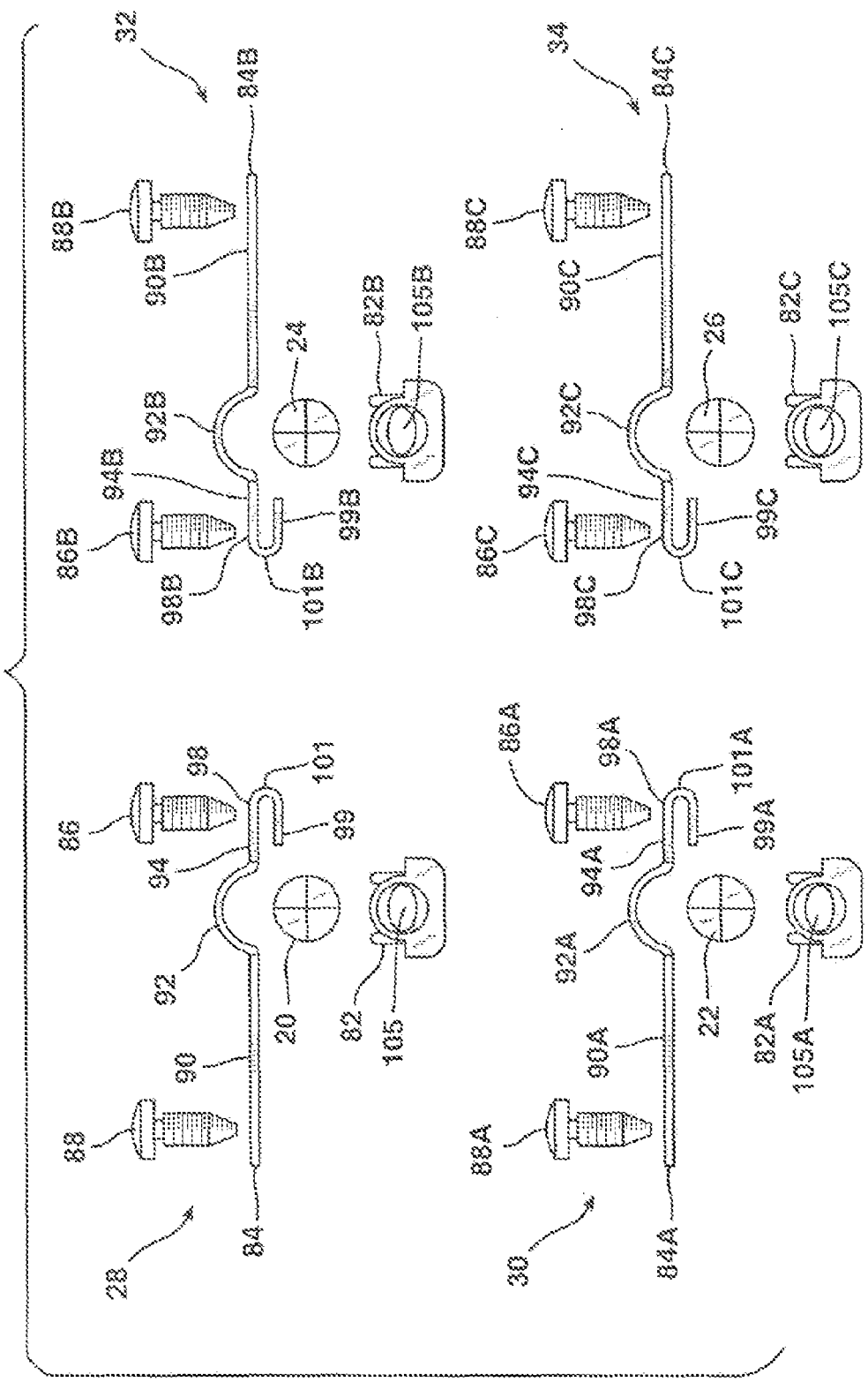
FIG. 5 is an exploded view of the four collimation lens assemblies of FIG. 4 taken from the laser diode side of the assemblies.

Referring now to FIG. 5, the first mounting bracket 84 comprises a first section 90, a second section 92, and a compressible third section 94. The first section 90 includes an aperture for receiving the second fastener 88 for fixedly coupling the first section 90 to the printhead mounting feature 81, see FIGS. 1, 3, 5 and 7. In the illustrated embodiment, the barrel-shaped housing 82 is generally cylindrical in shape. The second section 92 is arcuate-shaped for receiving the barrel-shaped housing 82. The third section 94 includes an aperture for receiving the first fastener 86.

Referring again to FIG. 5, the first mounting bracket third section 94 in the illustrated embodiment comprises a substantially planar first part 93, spaced apart from and positioned substantially parallel with a substantially planar second part 99 and an arcuate-shaped third part 101 joining the first part 98 with the second part 99 into a generally U-shaped compressible third section. The first fastener 86 passes through apertures in the first part 98 and the second part 99 and further into a bore (not shown) in the printhead mounting feature 83, see FIG. 7. In this fashion, an adjustable compressive force may be applied to the compressible third section 94 in a direction parallel to the axis of the first fastener 86 by increasing or decreasing a tightening torque applied to first fastener 94.

Figure 4:
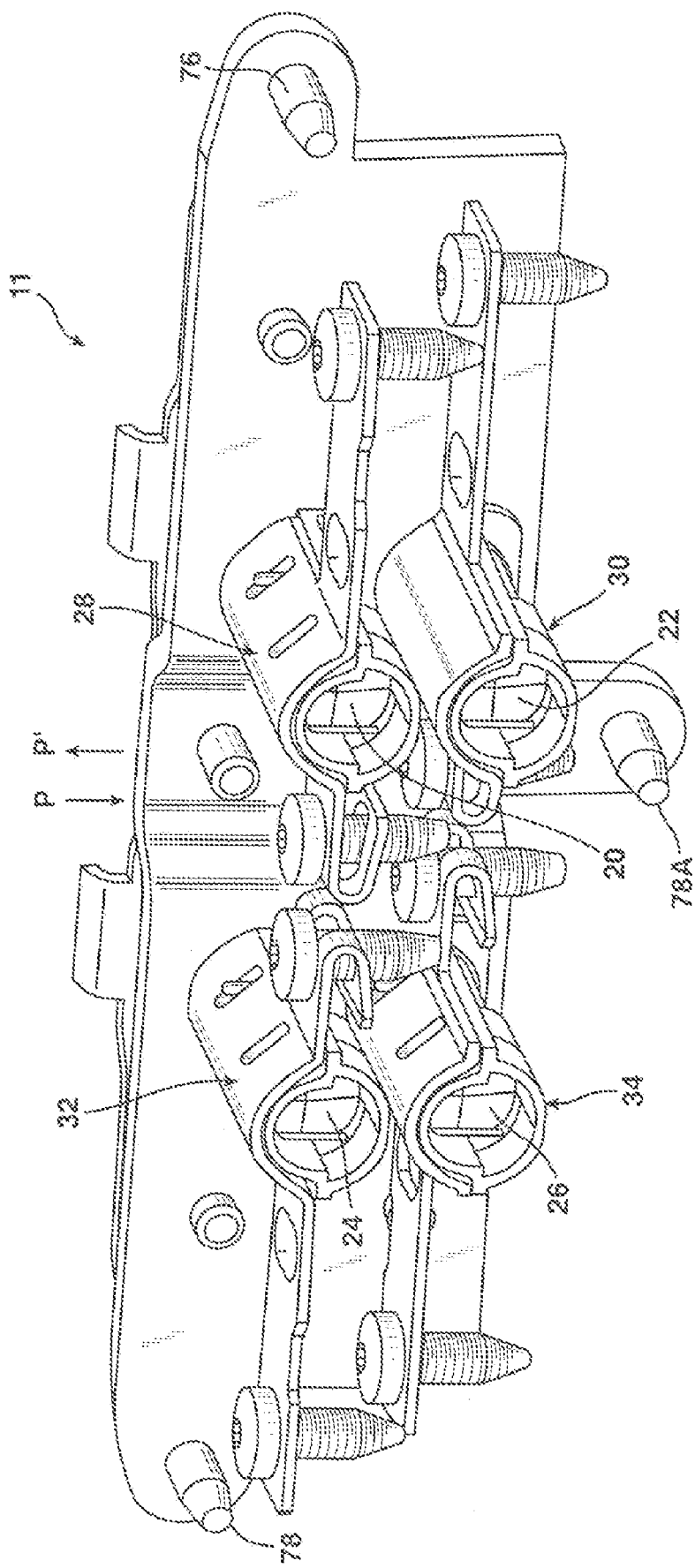
FIG. 4 is a diagrammatic perspective view of four collimation fens assemblies of the present invention taken from lens side of the assemblies.

Referring now to FIGS. 4 and 5, the U-shaped compressible third section 94 may be made from a material such as for example, zinc plated cold rolled steel per ASTM A591-98 with steel substrate per ASTM A109-00, that will yield or deflect from a non-deflected state as a compressive force is applied by increasing the tightening torque applied to the first fastener 86, causing the first part 98 to move in a first direction P, see FIG. 4. Conversely, decreasing the tightening torque applied to the first fastener 86 decreases the compressive force applied to the compressible third section 94, allowing the first part 98 to return substantially to its non-deflected state and move in a second direction P', see FIG. 4. The first and second directions P and P' define a process direction.

The barrel-shaped housing 82 is fixedly coupled to the arcuate-shaped second section 92 of the first mounting bracket 84, such as by a conventional adhesive or a heat-staking operation. An aperture 105 is defined by an initial portion of the barrel-shaped housing 82, see FIGS. 1 and 5. The laser beam emitted from the laser diode 12 passes through the aperture 105 prior to passing through the first collimation lens 20. Thus, the aperture 105 only allows a portion of the generally diverging laser beam emitted form laser diode 12 to pass into and through the barrel-shaped housing 82 and then through the first collimation lens 20. The first collimation lens 20 is fixedly mounted within the first barrel-shaped housing 82.

The first mounting bracket second section 92 is integral with the compressible third section 94 and also to the first section 90 on an end opposite to that coupled to the third section 94. Thus, as third section 94 moves in the first direction P in response to the application of an increasing compressive force applied by the first fastener 86, the barrel-shaped housing 82 with the first collimation lens 20 therein moves about a slight arc 107, see FIG. 7, defined by a pivoting motion of the first, second and third sections 90, 92 and 94 about a pivot axis $A_2$. Conversely, as third section 94 moves in the second direction P' in response to a decreasing compressive force applied by the first fastener 86, the barrel-shaped housing 82 with the first collimation lens 20 therein moves about the same arc previously defined, substantially in the second direction P', see FIG. 7. By moving the barrel-shaped housing 82 in the process direction P-P', the location at which the collimated laser beam strikes the first pre-scan lens 36 can be varied. By varying the location where the beam strikes the first pre-scan lens 36, the position of the beam exiting the first pre-scan lens 36 can be adjusted so that the beam strikes the rotating mirror at a desired location in the process direction.

U-shaped compressible third section 94 is configured such that a sufficient range of motion is provided in the process direction P-P' so that the laser beam emitted from the first laser diode 12 and passing through first lens assembly 28 can be made to strike the first, pre-scan lens 36 at a position that will result in the laser beam converging to a proper location on the rotating mirror (not shown) in the process direction P-P'.

Figure 7:
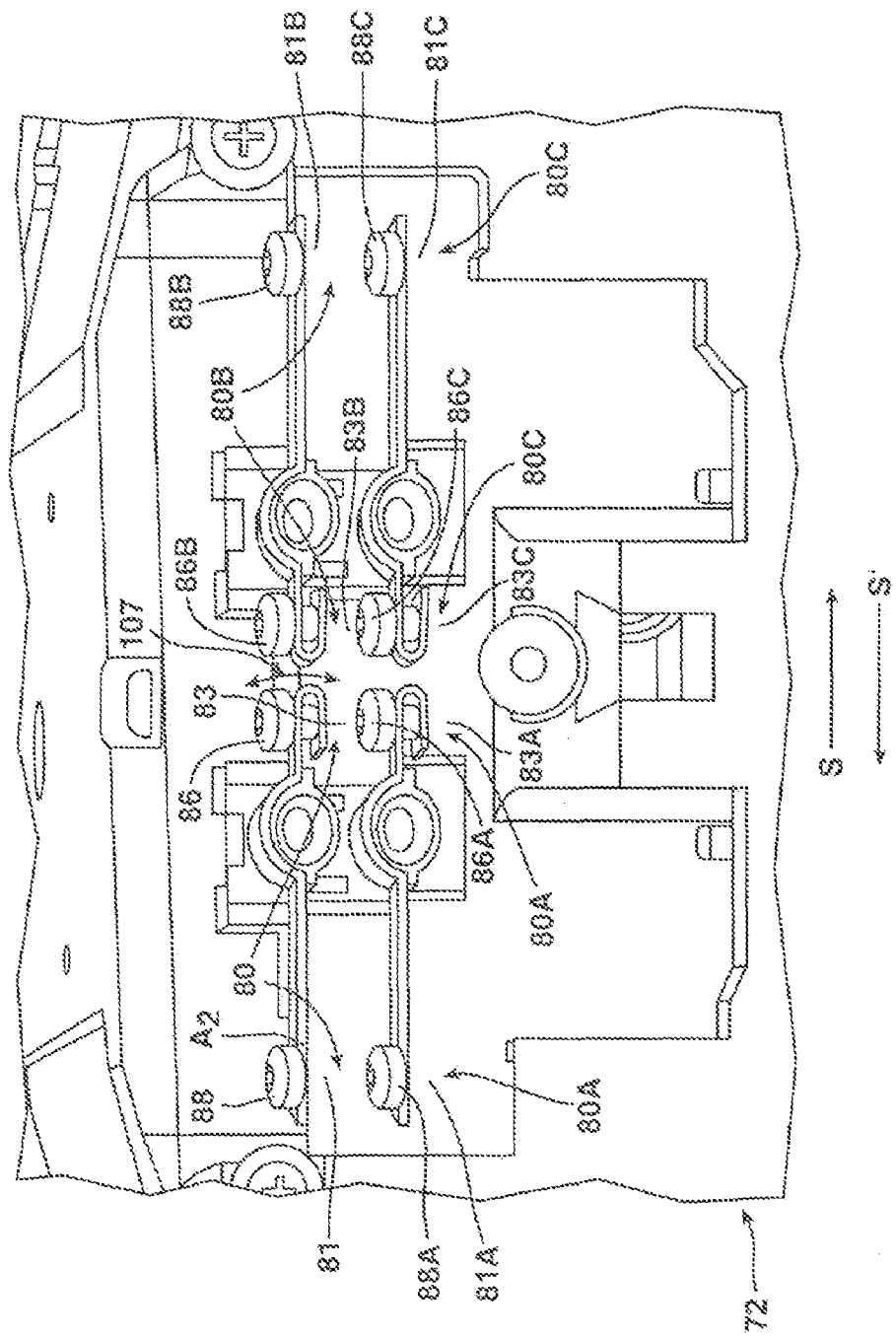
FIG. 7 is a perspective view of four collimation lens assemblies of the present invention mounted in a printhead housing taken from the lens side of the assemblies.

The second lens assembly 30 comprises a second mounting structure 80A, the second collimation lens 22, a second barrel-shaped housing 82A, a second mounting bracket 84A and third and fourth fasteners 86A and 88A, see FIGS. 5 and 7. The second mounting structure 80A comprises mounting features 81A and 83A forming part of the printhead housing 72, see FIG. 7.

Referring now to FIG. 5, the second mounting bracket 84A comprises a first section 90A, a second section 92A, and a compressible third section 94A. The first section 90A includes an aperture for receiving the fourth fastener 88A for fixedly coupling the first section 90A to the printhead mounting feature 81A, see FIGS. 1, 3, 5 and 7. In the illustrated embodiment the barrel-shaped housing 82A is generally cylindrical in shape. The second section 92A is arcuate-shaped for receiving the barrel-shaped housing 82A. The third section 94A includes an aperture for receiving the third fastener 86A.

The second mounting bracket third section 94A in the illustrated embodiment comprises a substantially planar first part 98A, spaced apart from and positioned substantially parallel with a substantially planar second part 99A and an arcuate-shaped third part 101A joining the first part 98A with the second part 99A into a generally U-shaped compressible third section. The third fastener 86A passes through apertures in the first part 98A and the second part 99A and further into a bore (not shown) in a printhead mounting feature 83A, see FIGS. 1, 3, 5, and 7. In this fashion, an adjustable compressive force may be applied to the compressible third section 94A in a direction parallel to the axis of the third fastener 86A by increasing or decreasing a tightening torque applied to third fastener 86A.

By increasing the compressive force applied to the compressible third section 94A by the third fastener 86A, the third section first part 98A, the second barrel-shaped housing 82A and the second collimation lens 22 move in the direction P, see FIG. 4. Conversely, by decreasing the compressive force applied to the compressible third section 94A by the third fastener 86A; the third section first part 98A, the second barrel-shaped housing 82A and the second collimation lens 22 move in the direction P'. By moving the second barrel-shaped housing 82A in the process direction P-P' the location at which the collimated second laser beam originating from the second laser diode 14 strikes the first pre-scan lens 36 can be varied. By varying the location where the second beam strikes the first pre-scan lens 36, the position of the second beam exiting the first pre-scan lens 36 can be adjusted so that the beam strikes the rotating mirror at a desired location in the process direction.

The third lens assembly 32 comprises a third mounting structure 80B, the third collimation lens 24, a third barrel-shaped housing 82B, a third mounting bracket 84B and fifth and sixth fasteners 86B and 88B, see FIGS. 1, 5 and 7. The third mounting structure 80B comprises mounting features 81B and 83B forming part of the printhead housing 72, see FIGS. 1 and 7.

Referring to FIG. 5, the third mounting bracket 84B comprises a first section 90B, a second section 92B, and a compressible third section 94B. The first section 90A includes an aperture for receiving the sixth fastener 88B for fixedly coupling the first section 90B to the printhead mounting feature 81B, see FIGS. 1, 3, 5 and 7. In the illustrated embodiment, the barrel-shaped housing 82B is generally cylindrical in shape. The second section 92B is arcuate-shaped for receiving the barrel-shaped housing 82B. The third section 94B includes an aperture for receiving the fifth fastener 86B.

The third mounting bracket third section 94B in the illustrated embodiment comprises a substantially planar first part 98B, spaced apart from and positioned substantially parallel with a substantially planar second part 99B and an arcuate-shaped third pad 101B joining the first part 98B with the second part 99B into a generally U-shaped compressible third section. The fifth fastener 86B passes through apertures in the first pad 98B and the second part 99B and further into a bore (not shown) in the printhead mounting feature 83B, see FIGS. 1, 3, 5, and 7. In this fashion, an adjustable compressive force may be applied to the compressible fifth section 94B in a direction parallel to the axis of the fifth fastener 86B by increasing or decreasing the tightening torque applied to fifth fastener 86B.

By increasing the compressive force applied to the compressible third section 94B by the fifth fastener 86B, the third section first part 98A, the third barrel-shaped housing 82B and the third collimation lens 22 move in the direction P, see FIG. 4. Conversely, by decreasing the compressive force applied to the compressible third section 94B by the fifth fastener 86B, the third section first part 98B, the third barrel-shaped housing 82B and the third collimation lens 22 move in the direction P'. By moving the third barrel-shaped housing 82B in the process direction P-P' the location at which the collimated third laser beam originating from the third laser diode 16 strikes the second pre-scan lens 38 can be varied. By varying the location where the third beam strikes the second pre-scan lens 38, the position of the third beam exiting the second pre-scan lens 38 can be adjusted so that the beam strikes the rotating mirror at a desired location in the process direction.

The fourth lens assembly 34 comprises a fourth mounting structure 80C, the fourth collimation lens 26, a fourth barrel-shaped housing 82C, a fourth mounting bracket 84C and seventh and eighth fasteners 86C and 88C, see FIGS. 5 and 7. The fourth mounting structure 80C comprises mounting features 81C and 83C forming part of the printhead housing 72, see FIG. 7.

Referring to FIG. 5, the fourth mounting bracket 84C comprises a first section 90C, a second section 92C, and a compressible third section 94C. The first section 90C includes an aperture for receiving the eighth fastener 88C for fixedly coupling the first section 90C to the printhead mounting feature 81C, see FIGS. 1, 3, 5 and 7. In the illustrated embodiment, the barrel-shaped housing 82C is generally cylindrical in shape. The second section 92C is arcuate-shaped for receiving the barrel-shaped housing 82C. The third section 94C includes an aperture for receiving the seventh fastener 86C.

The fourth mounting bracket third section 94C in the illustrated embodiment comprises a substantially planar first part 98C, spaced apart from and positioned substantially parallel with a substantially planar second part 99C and an arcuate-shaped third part 101C joining the first part 98C with the second part 99C into a generally U-shaped compressible third section. The seventh fastener 86C passes through apertures in the first part 98C and the second part 99C and further into a bore (not shown) in the printhead mounting feature 83C, see FIGS. 1, 3, 5, and 7. In this fashion, an adjustable compressive force may be applied to the compressible third section 94C in a direction parallel to the axis of the seventh fastener 86C by increasing or decreasing a tightening torque applied to seventh fastener 86C.

By increasing the compressive force applied to the compressible third section 94C by the seventh fastener 86C, the third section first part 98C, the fourth barrel-shaped housing 82C and the fourth collimation lens 26 move in the direction P, see FIG. 4. Conversely, by decreasing the compressive force applied to the compressible third section 94C by the seventh fastener 86C, the third section first part 98C, the fourth barrel-shaped housing 82C and the fourth collimation lens 26 move in the direction P'. By moving the fourth barrel-shaped housing 82C in the process direction P-P', the location at which the collimated fourth laser beam originating from the fourth laser diode 18 strikes the second pre-scan lens 38 can be varied. By varying the location where the fourth beam strikes the second pre-scan lens 38, the position of the fourth beam exiting the second pre-scan lens 38 can be adjusted so that the beam strikes the rotating mirror at a desired location in the process direction.

Proper operation of the printhead 10 also requires that the lens assemblies 28, 30, 32 and 34 be adjusted in a scan direction, defined by arrows S and S' in FIG. 7, during manufacturing. Scan direction adjustment of the first lens assembly 28 may be effected during assembly by extending the first fastener 86 and the second fastener 88 through the respective apertures in first mounting bracket 84 and further into the respective bores (not shown) in the mounting features 83 and 81. The first fastener 86 and the second fastener 88 are tightened sufficiently to retain the first mounting bracket 84 generally in place but allow some movement of the first mounting bracket 84 relative to the mounting features 83 and 81 in the scan direction S-S', see FIG. 7. Apparatus not shown may be used to determine when the beam emitted by the first laser diode 12 is properly located in the scan direction S-S' as the first mounting bracket 84 is moved in the scan direction. Once the first mounting bracket 84 is properly positioned such that the first laser beam is properly positioned in the scan direction S and S' the second fastener 88 is securely tightened so as to prevent movement of the first mounting bracket 84 in the scan direction S-S'.

Having positioned the first lens assembly 32 in proper position in the scan direction S-S' the first lens assembly 32 is then adjusted in the process direction P-P' as previously discussed, i.e., the compressive force applied to the first mounting bracket third section 94 via the first fastener 86 is adjusted so that the laser beam emitted from the first laser diode 12 and passing through first lens assembly 28 strikes the first pre-scan lens 36 at a position that will result, in the laser beam converging to a proper location on the rotating mirror (not shown) in the process direction P-P'. Once the scan and process adjustments have been effected, the first laser diode assembly 100 may be adjusted in the focus direction F-F' as also previously discussed. The second, third and fourth lens assemblies, 30, 32 and 34 and second, third and fourth laser diode assemblies 102, 104 and 106 are adjusted in a like manner during manufacturing.

Figure 8:
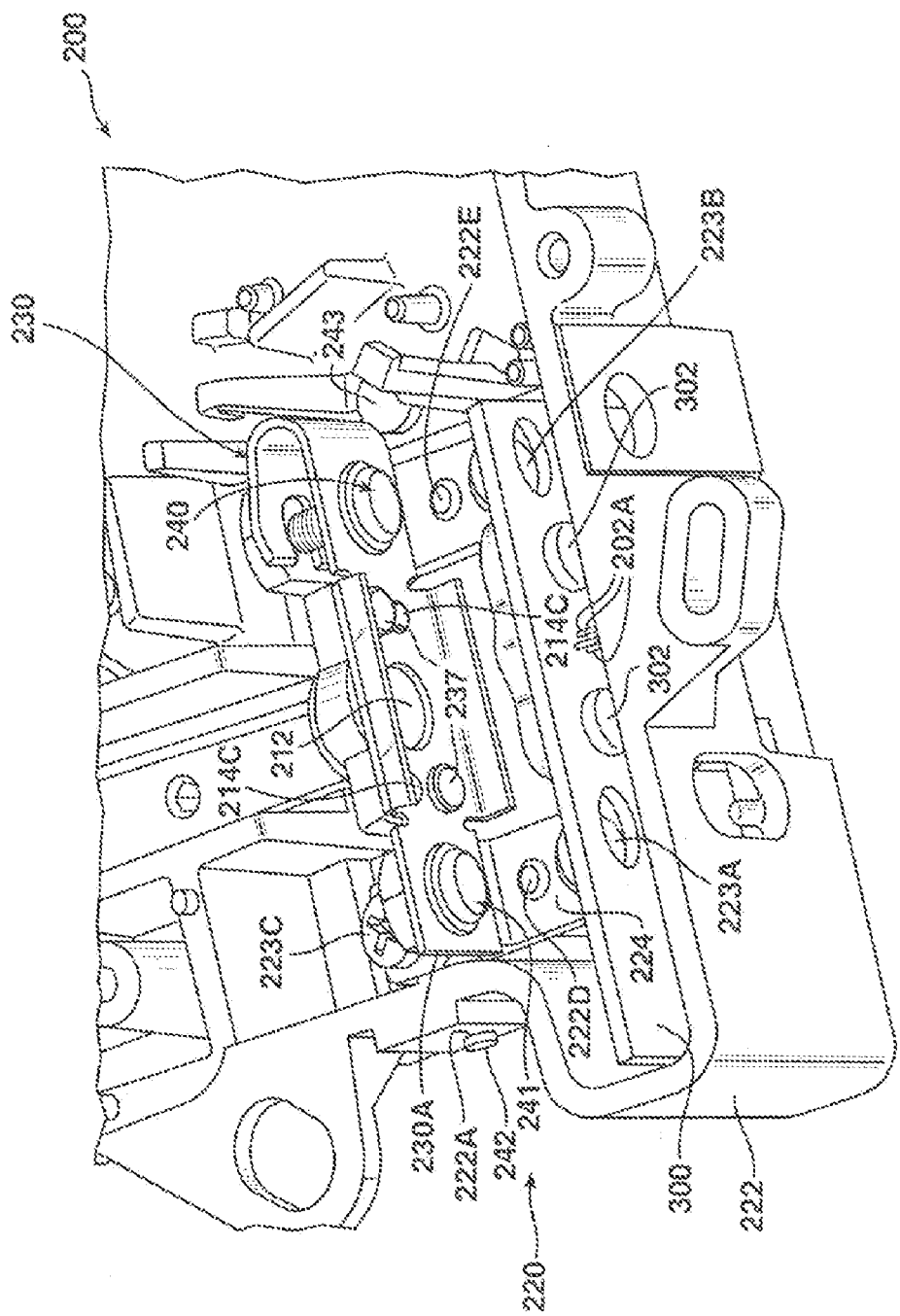
FIG. 8 is a perspective view of a laser diode/collimation lens apparatus constructed in accordance with a third embodiment of the present invention.

Referring now to FIG. 8, a laser diode/collimation lens apparatus 200 constructed in accordance with a third embodiment of the present invention is illustrated. The laser diode/collimation apparatus 200 comprises a laser diode 202, see FIGS. 9 and 10, for generating a laser beam. The laser diode/collimation lens apparatus 200 further comprises a collimation lens structure 210, see FIG. 9, a mounting structure 220, a lens structure bracket 230 and first, second, third and fourth fasteners 240-243, see also FIG. 8.

Figure 9:
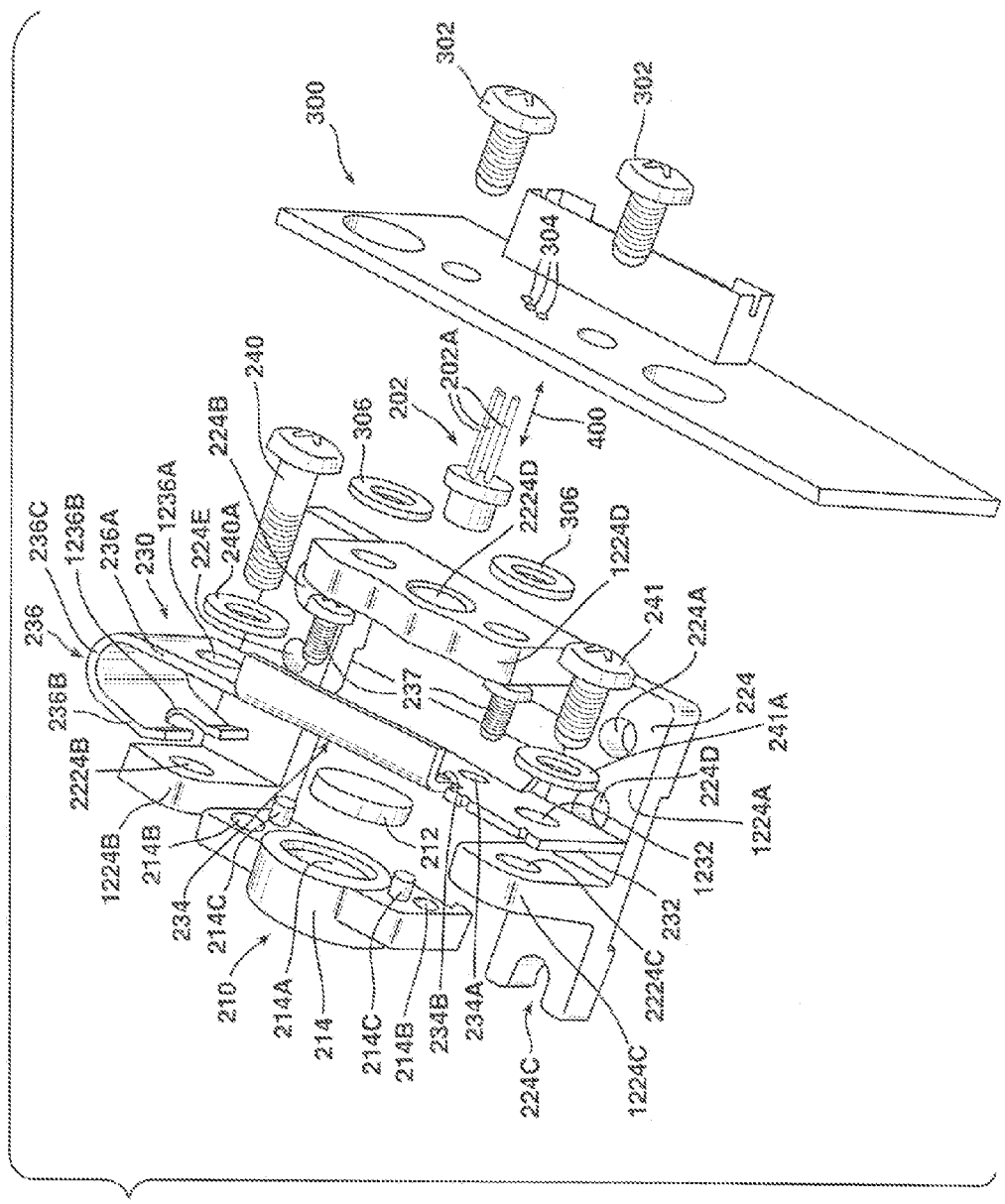
FIG. 9 is an exploded perspective view of the laser diode/collimation apparatus of FIG. 8 with a housing removed.

The collimation lens structure 210 may comprise a collimation lens 212 and a lens keeper 214 including a bore 214A for receiving the collimation lens 212, see FIG. 9. The collimation lens 212 may be fictionally held in position between the lens keeper 214 and the lens structure bracket 230 via engaging portions on the lens keeper 214 and the lens structure bracket 230, which engaging portions contact outer circumferential sections of opposing sides of the lens 212.

The mounting structure 220 may comprise a printhead housing 222 and a mounting bracket 224 coupled to the housing 222 via bolts or screws 223A-223C, which pass through openings 224A, 224B and a slot 224C in the mounting bracket 224 and engage pilot holes (not shown) in the housing 222. In the illustrated embodiment, the housing 222 further includes first and second alignment pins 222D and 222E, see FIG. 8, which pins 222D and 222E are received in corresponding openings 224D, 224E in the mounting bracket 224, see FIG. 10, so as to ensure that the bracket 224 is correctly aligned relative to the housing 222.

The mounting bracket 224 comprises a base 1224A and first, second and third mount members 1224B-1224D, see FIG. 9. The third mount member 1224D may include an aperture 2224D for receiving the laser diode 202. The laser diode 202 is maintained in the aperture 2224D via a friction press fit. A conventional laser diode driver circuit board 300 is coupled to the third mount member 1224D via bolts 302 engaging threaded bores 3224D in the third mount member 1224D, see FIGS. 8 and 9. Conventional washers 306, through which the bolts 302 pass, are provided between the board 300 and the third mount member 1224D. Conductors 202A from the laser diode 202 pass through and are soldered near bores 304 in the circuit board 300 and are connected to conventional drive circuitry (not shown) for effecting operation of the laser diode 202.

The lens structure bracket 230 may comprise a first section 232, a second section 234 formed integral with the first section 232 and a compressible third section 236 formed integral with the second section 234. The lens keeper 214 is coupled to the second section 234 of the lens structure bracket 230 via bolts or screws 237 which pass through bores 234A, only one of which is shown in FIG. 9, in the second section 234 and engage pilot holes 214C in the lens keeper 214. Pins 214C on the lens keeper 214 engage bores 234B, only one of which is shown in FIG. 9, in the second section 234 of the lens structure bracket 230 so as to ensure that the lens keeper 214 is correctly aligned relative to the tens structure bracket 230.

The lens structure bracket third section 236 may comprise first and second spaced apart parts 236A and 236B having oversized apertures 1236A and 1238B for receiving the first fastener 240 and a third part 236C joining the first and second pads 236A and 236B integrally together so as to define a generally U-shaped compressible third section. In the illustrated embodiment, the oversized aperture 1236B comprises an oversized elongated slot, see FIG. 8.

The first fastener 240 passes through a conventional washer 240A, the apertures 1236A and 1236B in the first and second parts 236A and 236B of the lens structure bracket third section 236 and engages a threaded bore 2224B in the first mount member 1224B of the mounting bracket 224, see FIG. 9. The first fastener 240 is adjustable so as to cause the lens structure bracket second section 234 and the collimation lens structure 210 to move relative to the mounting bracket 224 to change a distance between the laser diode 202 and the collimation lens 212 in a focus direction, designated by arrow 400 in FIG. 9.

The second fastener 241 may pass through a conventional washer 241A, an oversized bore 1232 in the first section 232 of the lens structure bracket 230 and engage a threaded bore 2224C in the second mount member 1224C of the mounting bracket 224, see FIG. 9.

The third fastener 242 passes through a threaded bore 222A in the printhead housing 222 and is capable of engaging a sidewall 230A of the lens structure bracket 230, see FIGS. 8 and 10. The third fastener 242 is adjustable so as to cause the lens structure bracket 230, the fens keeper 214 and the collimation lens 212 to move relative to the mounting bracket 224 to change a position of the collimation lens 212 relative to the laser diode 202 in a scan direction, designated by arrow 402 in FIG. 10.

The fourth fastener 243 passes through a threaded bore (not shown) in the printhead housing 222. A head portion 243A of the fastener 243 is capable of engaging a bottom surface 2236A of the third section 236 of the lens structure bracket 230 to cause the lens structure bracket 230, the lens keeper 214 and the collimation lens 212 to move relative to the mounting bracket 224 to change a position of the collimation lens 212 relative to the laser diode 202 in the process direction, designated by arrow 404 in FIG. 10.

Initially, scan and process direction adjustments of the collimation lens 212 are effected by passing the first fastener 240 through the washer 240A, the apertures 1236A and 1236B in the first and second parts 236A and 236B of the lens structure bracket third section 236 and into the threaded bore 2224B in the first mount member 1224B of the mounting bracket 224. Further, the second fastener 241 is passed through the washer 241A, the bore 1232 in the first section 232 of the lens structure bracket 230 and the threaded bore 2224C in the second mount member 1224C of the mounting bracket 224. The first fastener 240 and the second fastener 241 are tightened sufficiently to retain the lens structure bracket 230 generally in position on the mounting bracket 224 but allow some movement of the lens structure bracket 230 relative to the mounting bracket 224 in the focus, scan and process directions 400, 402 and 404.

An adjustment of the collimation lens 212 in the scan direction 402 is effected by rotating the fastener 242, while an adjustment of the collimation lens 212 in the process direction is effected by rotating the fastener 243. Adjustment of the collimation lens 212 in the scan and process directions 402 and 404 effects movement of the beam emitted by the laser diode 202 in the scan and process directions 402 and 404. Apparatus not shown may be used to determine when the beam emitted by the laser diode 202 is properly located in the scan and process directions 402 and 404. Once the lens structure bracket 230 is properly positioned such that the collimation lens 212 and, hence, the laser beam, are properly positioned in the scan and process directions 402 and 404, the second fastener 241 is securely tightened so as to prevent movement of the lens structure bracket 230 in the scan and process directions 402 and 404.

Having positioned the lens structure bracket 230 in proper position in the scan and process directions 402 and 404, the collimation lens 212 is then adjusted in the focus direction 400 via the first fastener 240. By increasing a compressive force applied to the compressible third section 236 of the lens structure bracket 230 by the first fastener 240, the collimation lens 212 moves away from the laser diode 202, which is fixed in position relative to the mounting bracket 224. By decreasing a compressive force applied to the compressible third section 236 of the lens structure bracket 230 by the first fastener 240, the collimation lens 212 moves towards from the laser diode 202. Apparatus not shown may be used to determine when the collimation lens 212 is properly located relative to the laser diode 202 such that the beam emitted by the laser diode 202 is focused, i.e., collimated or nearly collimated.

It is contemplated that the laser diode/collimation lens apparatus 200 may be incorporated info a mono laser printer. If is also contemplated that four separate laser diode/collimation lens apparatuses 200 may be incorporated into a color laser printer. When used in a color laser printer, two or more laser diode/collimation lens apparatuses 200 may share a single printhead housing.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A laser diode assembly comprising:
    a mounting structure;
    a laser diode;
    a mounting bracket comprising a first section capable of being coupled to said mounting structure, a second section coupled to said first section having an aperture for receiving said laser diode, and a compressible third section coupled to said second section; and
    a first fastener coupled to said mounting structure and in engagement with said mounting bracket third section, said fastener being adjustable so as to cause said mounting bracket second section to move relative to said mounting structure to change a distance between said laser diode and said mounting structure;
    wherein said mounting bracket third section comprises first and second spaced apart parts and a third part joining said first and second parts together, said first, second and third parts define a generally U-shaped third section, and said first and second parts comprise apertures for receiving said first fastener.

2. The laser diode assembly as set out in claim 1, wherein adjustment of said first fastener may cause said first and second parts to move relative to one another.

3. The laser diode assembly as set out in claim 1, further comprising a second fastener for coupling said mounting bracket first section to said mounting structure.

4. A lens assembly comprising:
    a mounting structure;
    a lens;
    a barrel for receiving said lens;
    a mounting bracket comprising a first section capable of being coupled to said mounting structure, a second section coupled to said first section and shaped to engage said barrel, and a compressible third section coupled to said second section; and
    a first fastener coupled to said mounting structure and in engagement with said mounting bracket third section, said fastener being adjustable so as to cause said mounting bracket second section to move relative to said mounting structure to change a position of said lens relative to said mounting structure, wherein said mounting bracket third section comprises first and second spaced apart parts and a third part joining said first and second parts together, said first, second and third parts define a generally U-shaped third section, and said first and second parts comprise apertures for receiving said first fastener.

5. The lens assembly as set out in claim 4, wherein adjustment of said first fastener may cause said first and second parts to move relative to one another.

6. The lens assembly as set out in claim 4, wherein said mounting bracket second section is coupled to said barrel.

7. The lens assembly as set out in claim 4, wherein said barrel has a generally cylindrical shape and also defines an aperture for a laser beam directed toward said lens.

8. The lens assembly as set out in claim 7, wherein said second section has a curved shaped to receive said generally cylindrical shaped barrel.

9. The lens assembly as set out in claim 4, wherein said lens is mounted within said barrel.

10. The lens assembly as set out in claim 4, further comprising a second fastener for coupling said mounting bracket first section to said mounting structure.

11. A laser diode/collimation lens apparatus comprising:
    a laser diode for generating a laser beam;
    a collimation lens structure;
    a mounting structure;
    a lens structure bracket, capable of being coupled to said mounting structure and comprising a first section, a second section coupled to said first section, and a compressible third section coupled to said second section, said second section being configured to engage said collimation lens structure;
    a first fastener coupled to said mounting structure and in engagement with said lens structure bracket third section, said fastener being adjustable so as to cause said lens structure bracket second section and said collimation lens structure to move relative to said mounting structure to change a distance between said laser diode and said lens structure in a first direction, wherein said collimation lens structure comprises a collimation lens and a lens keeper for receiving said collimation lens, said lens keeper being coupled to said lens structure bracket second section, said mounting structure comprises a housing and a mounting bracket coupled to said housing, said mounting bracket comprises first, second and third mount members, said first fastener being coupled to said first mount member and said third mount member having an aperture for receiving the laser diode;
    a second fastener coupled to said second mount member and in engagement with said lens structure bracket first section;
    a third fastener coupled to said housing and in engagement with said lens structure bracket, said third fastener being adjustable so as to cause said lens structure bracket, said lens keeper and said collimation lens to move relative to said mounting bracket to change a position of said collimation lens relative to said laser diode in a second direction; and
    a fourth fastener coupled to said housing and in engagement with said lens structure bracket, said fourth fastener being adjustable so as to cause said lens structure bracket, said lens keeper and said collimation lens to move relative to said mounting bracket to change a position of said collimation lens relative to said laser diode in a third direction.

12. The laser diode/collimation lens apparatus as set out in claim 11, wherein said lens structure bracket third section comprises first and second spaced apart parts having oversized apertures for receiving said first fastener and a third part joining said first and second parts together defining a generally U-shaped third section.

* * * * *